(12) United States Patent
Yu et al.

(10) Patent No.: US 8,608,265 B2
(45) Date of Patent: Dec. 17, 2013

(54) PULSE WIDTH CONTROL DEVICE AND METHOD, INKJET PRINTING DEVICE USING THE DEVICE

(75) Inventors: Jianguo Yu, Beijing (CN); Feng Chen, Beijing (CN); Zhihong Liu, Beijing (CN)

(73) Assignees: Peking University Founder Group Co., Ltd., Beijing (CN); Peking University, Beijing (CN); Beijing Founder Electronics Co., Ltd., Beijing (CN)

( * ) Notice: Subject to any disclaimer, the term of this patent is extended or adjusted under 35 U.S.C. 154(b) by 394 days.

(21) Appl. No.: 13/062,596

(22) PCT Filed: Sep. 8, 2009

(86) PCT No.: PCT/CN2009/001012
§ 371 (c)(1),
(2), (4) Date: Mar. 7, 2011

(87) PCT Pub. No.: WO2010/025626
PCT Pub. Date: Mar. 11, 2010

(65) Prior Publication Data
US 2011/0164082 A1 Jul. 7, 2011

(30) Foreign Application Priority Data
Sep. 8, 2008 (CN) .......................... 2008 1 0119742

(51) Int. Cl.
*B41J 29/38* (2006.01)

(52) U.S. Cl.
USPC .......................................................... 347/10

(58) Field of Classification Search
CPC ..................... B41J 2/04581; B41J 2/04593
USPC .......... 347/9–11, 62, 63, 68, 70–72; 358/1.15
See application file for complete search history.

(56) References Cited

U.S. PATENT DOCUMENTS

| | | | |
|---|---|---|---|
| 6,439,679 B1 * | 8/2002 | Roylance | 347/9 |
| 6,680,988 B1 * | 1/2004 | Maeda et al. | 375/354 |
| 6,739,690 B1 | 5/2004 | Darling | |

FOREIGN PATENT DOCUMENTS

| | | |
|---|---|---|
| JP | 118612 A | 1/1999 |
| SU | 834856 A2 | 5/1981 |

* cited by examiner

*Primary Examiner* — An Do
(74) *Attorney, Agent, or Firm* — The Webb Law Firm (57) ABSTRACT

Disclosed is a pulse width control device, including: a first monostable multivibrator, for receiving a synchronization pulse, and generating a negative pulse whose width is a first preset threshold; a second monostable multivibrator, for receiving the synchronization pulse, and generating a positive pulse whose width is a second preset threshold; an inverter, for receiving the synchronization pulse, and inverting the synchronization pulse, and outputting an inverted synchronization pulse; and a flip-flop, for receiving the negative pulse, the positive pulse and the inverted synchronization pulse, and generating a synchronization pulse with a width between the first threshold and the second threshold.

13 Claims, 12 Drawing Sheets

| | input | | | output | |
|---|---|---|---|---|---|
| | Reset | A | B | Q | $\overline{Q}$ |
| operation mode 1 → | H | ⌐ | H | ⊓ | ⊔ |
| operation mode 2 → | H | L | ⌐ | ⊓ | ⊔ |

FIG. 7

|  | input | | | | output | |
|---|---|---|---|---|---|---|
|  | Set | Reset | CLK | D | Q | $\overline{Q}$ |
| operation mode 1 → | L | H | X | X | H | L |
| operation mode 2 → | H | L | X | X | L | H |
| operation mode 3 → | L | L | X | X | H* | H* |
| operation mode 4 → | H | H | ⤒ | H | H | L |
| operation mode 5 → | H | H | ⤒ | L | L | H |

PULSE WIDTH CONTROL DEVICE AND METHOD, INKJET PRINTING DEVICE USING THE DEVICE

FIELD OF THE PRESENT INVENTION

The present invention relates to a technical field of waveform adjustment, particularly to a pulse width control device and method.

BACKGROUND OF THE PRESENT INVENTION

Figure 1:
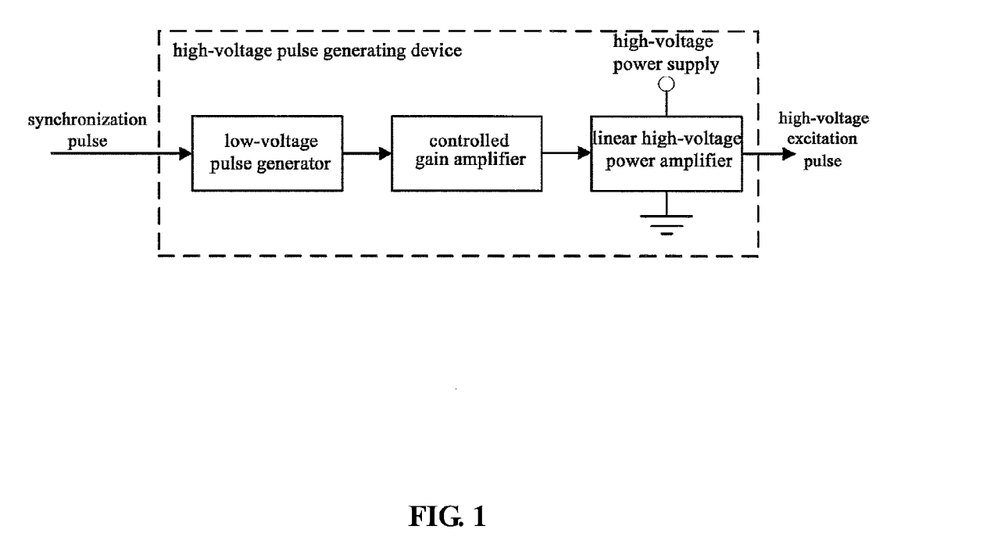
FIG. 1 is a schematic diagram showing a structure of a typical high-voltage pulse generating device in the prior art.

At present, an inkjet print head more widely used is a piezoelectric inkjet print head. A spray head of a general piezoelectric inkjet print head is a piezoelectric device, and each nozzle of the spray head is driven by a piece of piezoelectric ceramic wafer. When an excitation pulse voltage is applied to a corresponding piezoelectric ceramic wafer at a controlled slew rate, the piezoelectric ceramic wafer is excited to offset outwards to form a negative pressure wave, thereby absorbing ink into a cavity. After a fixed pulse lasts a period of time, the excitation pulse voltage is removed at a certain controlled slew rate. In this way, with relaxation and contraction of walls of the cavity, an overall positive pressure wave is made to propagate forwards to cause the nozzles to jet ink, thereby achieving inkjet printing.

Wherein the excitation pulse applied to an execution element of the piezoelectric ceramic wafer to drive it to deform is generally generated by a dedicated high-voltage pulse generating device. FIG. 1 shows a structure of a typical high-voltage pulse generating device for generating trapezoidal pulses, in which a low-voltage pulse generator generates a low-voltage excitation pulse required according to a front-end synchronization pulse, a subsequent controlled gain amplifier adjusts amplitude gain of the low-voltage excitation pulse, and finally a linear high-voltage power amplifier outputs a high-voltage excitation pulse required.

Figure 2:
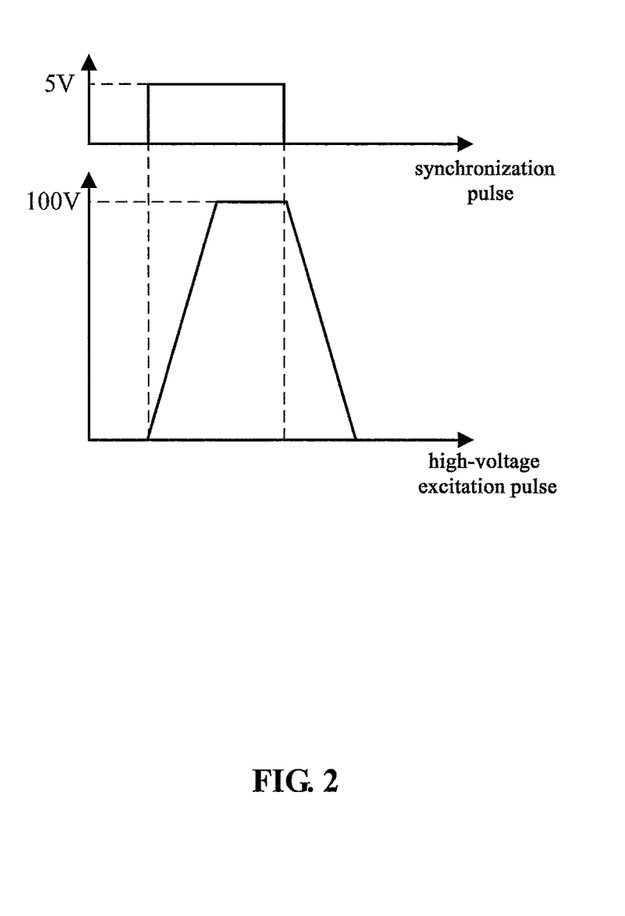
FIG. 2 is a schematic diagram showing a corresponding relationship between widths of a synchronization pulse and a high-voltage excitation pulse in the prior art.

The synchronization pulse input from the front end of the high-voltage pulse generating device as shown in FIG. 1 temporally controls the high-voltage excitation pulse finally output, and a corresponding relationship between waveforms of the two pulses is shown in FIG. 2, in which a lateral axis represents time, and a longitudinal axis represents voltage. It can be seen from FIG. 2 that the width (duration) of the synchronization pulse decides the duration of the high-voltage excitation pulse finally output, and an inappropriate width of the synchronization pulse will directly affect the output of the high-voltage excitation pulse and the normal operation of the spray head.

Figure 3:
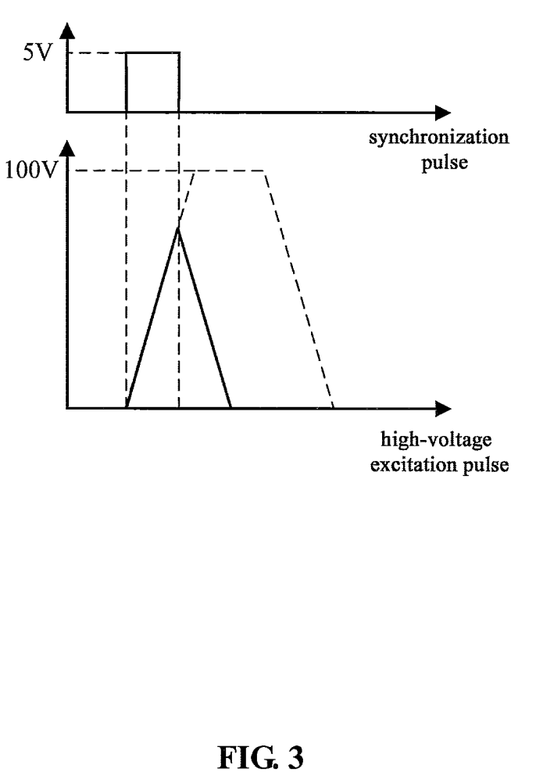
FIG. 3 is a schematic diagram showing an output waveform of a high-voltage excitation pulse generated when a synchronization pulse is too short in the prior art.
Figure 4:
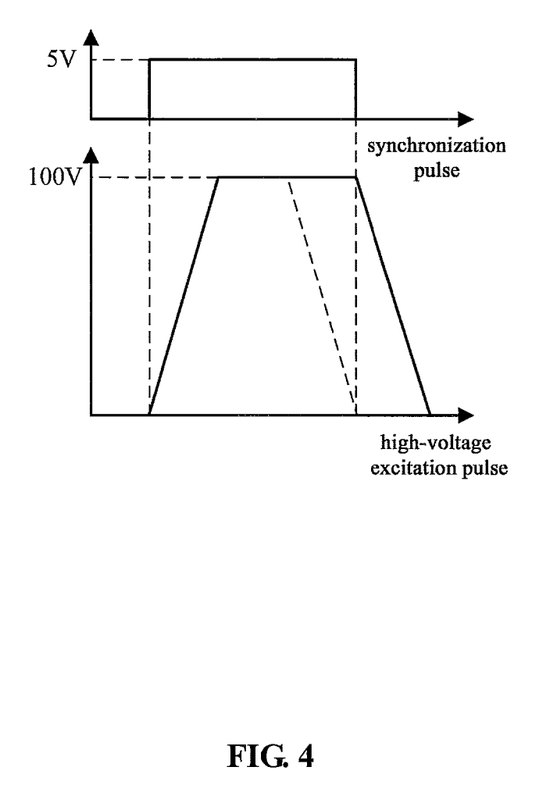
FIG. 4 is a schematic diagram showing an output waveform of a high-voltage excitation pulse generated when a synchronization pulse is too long in the prior art.

FIG. 3 shows an output waveform of the resultant corresponding high-voltage excitation pulse generated when the width of the synchronization pulse is too short. It can be seen that the output high-voltage excitation pulse assumes a waveform in a spike pulse form, and this high-voltage spike pulse, on one hand, can not drive the spray head to generate appropriate ink droplets and affects the lifetime of the spray head, and on the other hand, brings damage to the high-voltage pulse generating device itself. FIG. 4 shows an output waveform of the resultant corresponding high-voltage excitation pulse generated when the width of the synchronization pulse is too long. It can be seen that the duration of the high-voltage excitation pulse output is too long, and a high voltage is maintained for a long time on the spray head, which can not drive the spray head to generate appropriate ink droplets as well and would lead to fatigue of the spray head.

SUMMARY OF THE PRESENT INVENTION

Embodiments of the invention provide a pulse width control device and method as well as an inkjet printing device including the pulse width control device, to control width of a synchronization pulse input into a high-voltage pulse generating device, thereby avoiding adverse effect of too long or too short width of the synchronization pulse on the piezoelectric inkjet print head and guaranteeing ink jetting quality.

An inkjet printing device provided by the embodiments of the invention includes a spray head for jetting ink and a high-voltage pulse generating device for generating a high-voltage excitation pulse for controlling ink jetting of said spray head by using a synchronization pulse, the inkjet printing device further includes: a pulse width control device for controlling the width of the synchronization pulse input into said high-voltage pulse generating device, and said pulse width control device includes:

a first monostable multivibrator, for receiving the synchronization pulse, and using said synchronization pulse to generate and output a negative pulse whose width is a first preset threshold;

a second monostable multivibrator, for receiving said synchronization pulse, and using said synchronization pulse to generate and output a positive pulse whose width is a second preset threshold;

an inverter, for receiving said synchronization pulse, and reversion-processing said synchronization pulse and then outputting an inverted synchronization pulse; and a flip-flop, for receiving said negative pulse, said positive pulse and said inverted synchronization pulse, and generating and outputting a synchronization pulse with a width between said first threshold and the second threshold to said high-voltage pulse generating device.

A pulse width control device provided by the embodiments of the invention includes:

a first monostable multivibrator, for receiving a synchronization pulse, and using said synchronization pulse to generate and output a negative pulse whose width is a first preset threshold;

a second monostable multivibrator, for receiving said synchronization pulse, and using said synchronization pulse to generate and output a positive pulse whose width is a second preset threshold;

an inverter, for receiving said synchronization pulse, and reversion-processing said synchronization pulse and then outputting an inverted synchronization pulse; and a flip-flop, for receiving said negative pulse, said positive pulse and said inverted synchronization pulse, and generating and outputting a synchronization pulse with a width between said first threshold and the second threshold.

A pulse width control method provided by the embodiments of the invention includes:

a first monostable multivibrator receiving a synchronization pulse, and generating and outputting a negative pulse whose width is a first preset threshold;

a second monostable multivibrator receiving said synchronization pulse, and generating and outputting a positive pulse whose width is a second preset threshold;

an inverter receiving said synchronization pulse, and reversion-processing said synchronization pulse and then outputting an inverted synchronization pulse; and a flip-flop receiving said negative pulse, said positive pulse and said inverted synchronization pulse, and generating and outputting a synchronization pulse with a width between said first threshold and the second threshold.

The embodiments of the invention provide the pulse width control device connected to the high-voltage pulse generating device and said pulse width control device receives the synchronization pulse by the first monostable multivibrator, the second monostable multivibrator and the inverter, wherein the first monostable multivibrator uses said synchronization pulse to generate and output the negative pulse whose width is the first preset threshold; the second monostable multivibrator uses said synchronization pulse to generate and output the positive pulse whose width is the second preset threshold; the inverter inverts the synchronization pulse and then outputs the inverted synchronization pulse; and the flip-flop receives said negative pulse, said positive pulse and said inverted synchronization pulse, and generates and outputs the synchronization pulse with the width between said first threshold and the second threshold to said high-voltage pulse generating device, so that the control of the width of the synchronization pulse input into the high-voltage pulse generating device is achieved. Said high-voltage pulse generating device generates and outputs the high-voltage excitation pulse for controlling ink jetting of the spray head by using the synchronization pulse transmitted by said flip-flop, thereby avoiding the adverse effect of too long or too short width of the synchronization pulse on the piezoelectric inkjet print head, protecting the spray head of the piezoelectric inkjet print head and the high-voltage pulse generating device, and guaranteeing the ink jetting quality, moreover it is low in cost and easy to implement.

DETAILED DESCRIPTION OF THE PREFERRED EMBODIMENTS

Embodiments of the invention provide a pulse width control device and method as well as an inkjet printing device including the pulse width control device to control the width of the synchronization pulse input into the high-voltage pulse generating device, so as to avoid the adverse effect of too long or too short width of the synchronization pulse on the piezoelectric inkjet print head, and guarantee the ink jetting quality, moreover it is low in cost and easy to implement.

The pulse width as described in the embodiments of the invention is the duration of the pulse.

Technical solutions provided by the embodiments of the invention are explained in connection with the accompanying figures below.

Figure 5:
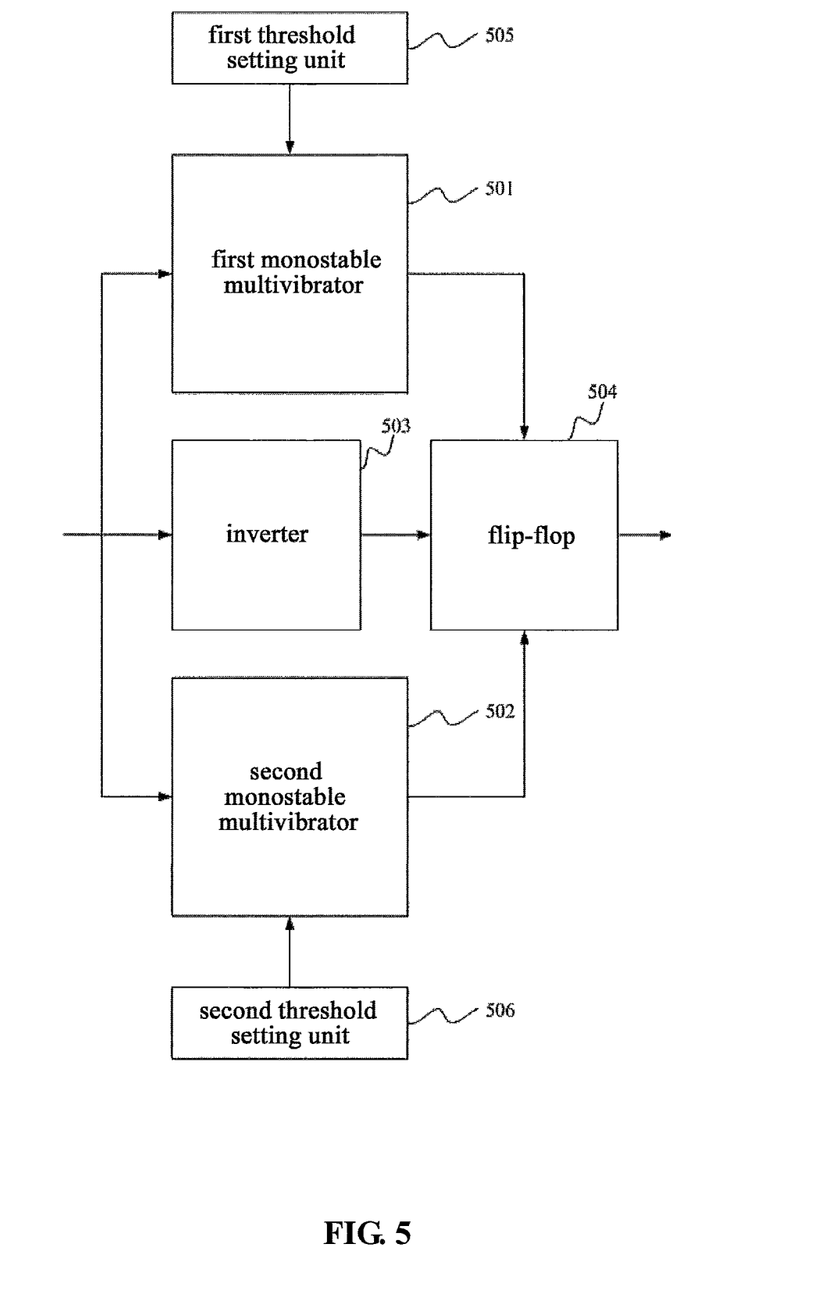
FIG. 5 is a schematic diagram showing a structure of a pulse width control device provided by an embodiment of the invention.

In order to protect the piezoelectric inkjet print head, guarantee the ink jetting quality and avoid interference of factors such as outside noise on the synchronization pulse, the embodiments of the invention provides the piezoelectric inkjet print head with a protection device connected to the high-voltage pulse generating device, a pulse width control device, to control the width of the synchronization pulse. Referring to FIG. 5, a pulse width control device provided by the embodiments of the invention includes:

A first monostable multivibrator 501, for receiving a synchronization pulse, and using said synchronization pulse to generate and output a negative pulse whose width is a first preset threshold;

A second monostable multivibrator 502, for receiving said synchronization pulse simultaneously with the first monostable multivibrator 501, and using said synchronization pulse to generate and output a positive pulse whose width is a second preset threshold;

An inverter 503, for receiving said synchronization pulse simultaneously with the first monostable multivibrator 501 and the second monostable multivibrator 502, and reversion-processing said synchronization pulse and then outputting an inverted synchronization pulse, that is, the level of the output inverted synchronization pulse is reversed to that of the input synchronization pulse;

A flip-flop 504, for receiving said negative pulse, said positive pulse and said inverted synchronization pulse, and generating and outputting a synchronization pulse with a width between said first threshold and said second threshold.

The high-voltage pulse generating device generates and outputs a high-voltage excitation pulse by using the synchronization pulse transmitted by the flip-flop 504, thereby avoiding the adverse effect of too long or too short width of the synchronization pulse on the piezoelectric inkjet print head and guaranteeing the ink jetting quality.

Further, said pulse width control device further includes:

a first threshold setting unit 505, for setting said first threshold for said first monostable multivibrator 501; and a second threshold setting unit 506, for setting said second threshold for said second monostable multivibrator 502.

A first resistor and a first capacitor are included in said first threshold setting unit 505, and setting said first threshold is achieved by setting values of said first resistor and said first capacitor.

A second resistor and a second capacitor are included in said second threshold setting unit 506, and setting said second threshold is achieved by setting values of said second resistor and said second capacitor.

Embodiments of the invention will be described in detail in connection with the particular circuit schematic diagram below.

Figure 6:
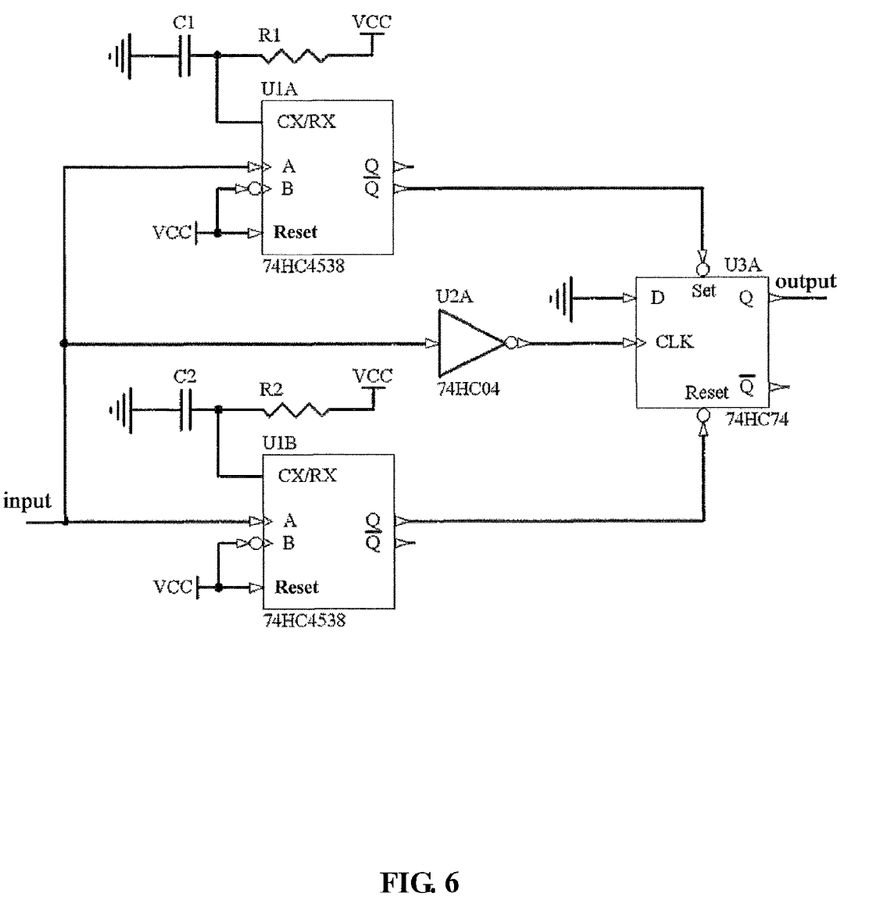
FIG. 6 is a schematic diagram showing a circuit structure of a pulse width control device provided by an embodiment of the invention.

The circuit for controlling the width of the synchronization pulse provided by the embodiments of the invention is as shown in FIG. 6, in which monostable multivibrators U1A and U1B with a model number of 74HC4538, an inverter U2A with a model number of 74HC04 and a D-type flip-flop U3A having Reset and Set functions with a model number of 74HC74 are included.

The monostable multivibrator with the model number of 74HC4538 can be triggered by a rising edge or a falling edge of an input pulse to generate a precise pulse with a certain width. The width of the output precise pulse is determined by external timing components, i.e. an external resistor Rx and an external capacitor Cx, and satisfies a following formula:

$$\tau = K \times Rx \times Cx \qquad \text{formula (I)}$$

Wherein, $\tau$ represents the temporal width of the output precise pulse, K represents a time constant, and the specific value of K is associated with a power supply voltage VCC, for example, the value of K is 0.7 when the power supply voltage VCC is larger than 4 volt (V). Then, when the value of K is selected, and the values of the external resistor Rx and the external capacitor Cx are selected as well, the width $\tau$ of the precise pulse output from the monostable multivibrator with the model number of 74HC4538 is set.

Figure 7:
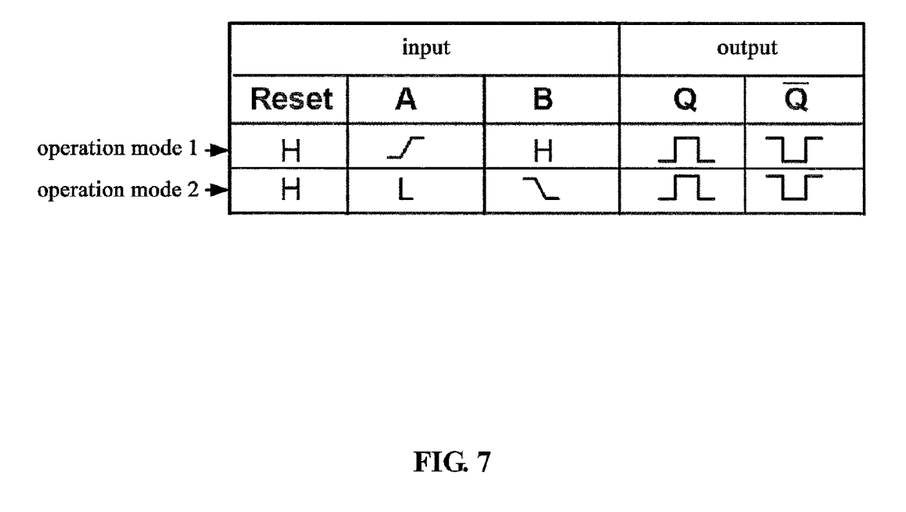
FIG. 7 is a schematic diagram showing the functionality of a monostable multivibrator employed by an embodiment of the invention.

FIG. 7 shows main functions of the monostable multivibrator with the model number of 74HC4538, which is a chip mainly operating in following two operation modes:

Operation mode 1: when a Reset pin is at high level and a falling edge-triggered input pin (B pin) is also at high level, the 74HC4538 chip operates in the operation mode 1. At this time, when a rising edge signal is input to a rising edge-triggered input pin (A pin), a positive pulse output pin (Q pin) will be triggered to generate a positive pulse with a fixed temporal width, and at the same time, a negative pulse with the same fixed temporal width is generated at a negative pulse output pin ($\overline{Q}$ pin).

Operation mode 2: when the Reset pin is at high level and the A pin is at low level, the 74HC4538 chip operates in the operation mode 2. At this time, when a falling edge signal is input to the B pin, the Q pin will be triggered to generate a positive pulse with a fixed temporal width, and at the same time, a negative pulse with the same fixed temporal width is generated at the $\overline{Q}$ pin.

It can be seen from the connection relationship of the pins of the 74HC4538 chip as shown in FIG. 6 that, the B pins and the Reset pins of the monostalbe multivibrators U1A and U1B are all connected to the power supply VCC, therefore, the B pins and the Reset pins are all at high level status, and the 74HC4538 chip operates in the operation mode 1 as shown in FIG. 7. Meanwhile, both the A pins of the 74HC4538 chips are connected to synchronization pulses input from the outside. That is, when a rising edge of an external synchronization pulse comes, the monostable multivibrators U1A and U1B are simultaneously triggered by the rising edge of the input synchronization pulse to simultaneously generate two precise pulse signals with fixed widths represented as U1A-$\overline{Q}$ and U1B-Q respectively, wherein the U1A-$\overline{Q}$ is a negative pulse, and the U1B-Q is a positive pulse.

The purpose of selecting the two monostable multivibrators U1A and U1B is to utilize their capabilities of generating pulses with fixed widths. That is, at the same time when an external synchronization pulse comes, two synchronization pulses whose widths are preset values are respectively generated by the two monostable multivibrators; the synchronization pulse generated by one monostable multivibrator is longer in width, and the synchronization pulse generated by the other is shorter in width, so as to limit the width of the input synchronization pulse to be within a range of widths of pulses output by the U1A and the U1B.

For example, a piezoelectric inkjet print head with a certain model number requires that the width of the synchronization pulse keep between 5 microseconds (μs) and 15 μs, then the value of the resistor R1 in FIG. 6 can be set to be 7.14 kilohm (Kom), the value of the capacitor C1 can be set to be 0.001 microfarad (g), the value of the resistor R2 can be set to be 21.4 Kom, and the value of the capacitor C2 can be set to be 0.001 μF. When the power supply voltage is 5V, the width it of the precise pulse U1A-$\overline{Q}$ and the width $\tau 2$ of the precise pulse U1B-Q generated respectively by the U1A and the U1B triggered by the rising edge signal of the synchronization pulse input from the outside are calculated by use of the formula (I) as follows:

$$\tau 1 = 0.7 \times R1 \times C1 = 0.7 \times 7.14 \text{ Kom} \times 0.001 \text{ μF} \approx 5 \text{ μs}$$

$$\tau 2 = 0.7 \times R2 \times C2 = 0.7 \times 21.4 \text{ Kom} \times 0.001 \text{ μF} \approx 15 \text{ μs}$$

It can be seen from the circuit in FIG. 6 that the pulse signals U1A-$\overline{Q}$ and U1B-Q are respectively connected to the Set pin and the Reset pin of the D-type flip-flop U3A having Reset and Set functions. Whereas the synchronization pulse signal input from the outside is connected to a clock (CLK) pin of the U3A through the inverter U2A, and a data (DATA) input pin (D pin) of the D-type flip-flop U3A is connected to the ground and is a low level signal. The signal output from the Q pin of the D-type flip-flop U3A is represented as U3A-Q, which is a synchronization pulse signal with a satisfactory width and used to be output to the rear-end high-voltage pulse generating device.

Figure 8:
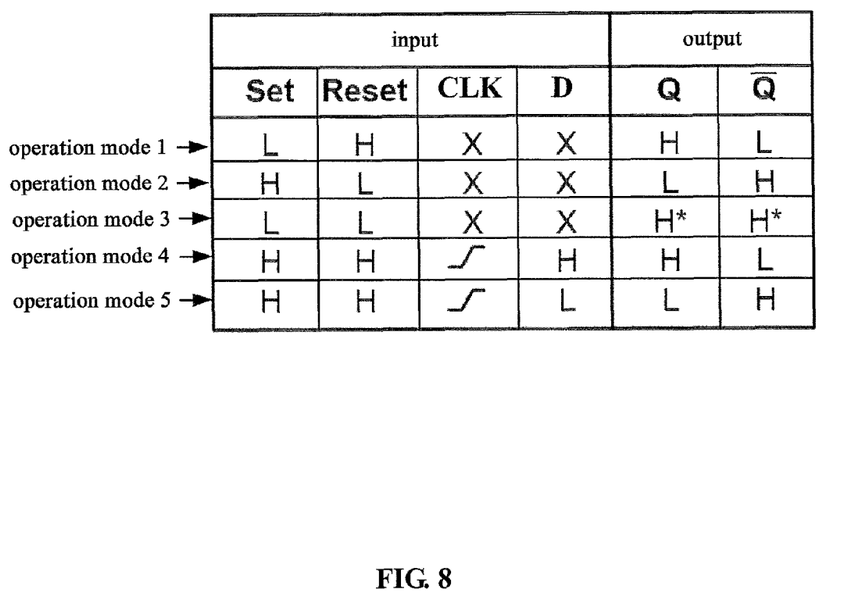
FIG. 8 is a schematic diagram showing the functionality of a D-type flip-flop employed by an embodiment of the invention.

FIG. 8 shows the main functions of the D-type flip-flop U3A with the model number of 74HC74 having Reset and Set functions used by the embodiments of the invention. The 74HC74 chip mainly operates in following five operation modes:

Operation mode 1: when the signal input to the Set pin is at low level and the signal input to the Reset pin is at high level, the chip operates in the operation mode 1, and irrespective of whether the levels of the signals input to the CLK pin and the D pin are high or low, the Q pin outputs a pulse signal at high level, and the $\overline{Q}$ pin outputs a pulse signal at low level.

Operation mode 2: when the signal input to the Set pin is at high level and the signal input to the Reset pin is at low level, the chip operates in the operation mode 2, and irrespective of whether the levels of the signals input to the CLK pin and the D pin are high or low, the Q pin outputs a pulse signal at low level, and the $\overline{Q}$ pin outputs a pulse signal at high level.

Operation mode 3: when both of the signals input to the Set pin and the Reset pin are at low level, the chip operates in the operation mode 3, and irrespective of whether the levels of the signals input to the CLK pin and the D pin are high or low, both the Q pin and the $\overline{Q}$ pin output pulse signals at high level.

Operation mode 4: when both of the signals input to the Set pin and the Reset pin are at high level and the signal input to the D pin is at high level, the chip operates in the operation mode 4, and when a rising edge signal is input to the CLK pin, the Q pin outputs a pulse signal at high level, and the $\overline{Q}$ pin outputs a pulse signal at low level.

Operation mode 5: when both of the signals input to the Set pin and the Reset pin are at high level and the signal input to the D pin is at low level, the chip operates in the operation mode 5, and when a rising edge signal is input to the CLK pin, the Q pin outputs a pulse signal at low level, and the $\overline{Q}$ pin outputs a pulse signal at high level.

Figure 9:
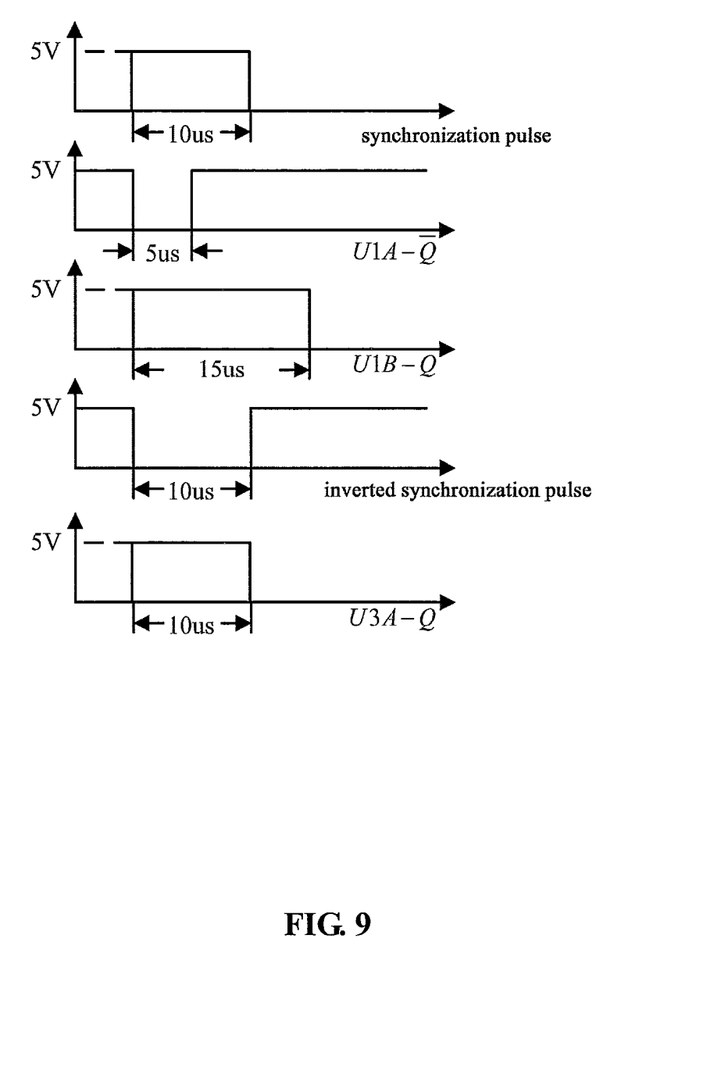
FIG. 9 is a schematic diagram showing waveforms of signals generated when a pulse width control device provided by an embodiment of the invention processes an input normal synchronization pulse.

When the synchronization pulse input from the outside is a positive pulse whose width is 10 μs and the widths of the pulses output from the monostable multivibrators U1A and U1B in the circuit as shown in FIG. 6 are respectively set to be 5 μs and 15 μs, the operation process of the circuit as shown in FIG. 6 is divided into following three statuses by referring to FIG. 9:

Status 1. No external synchronization pulse is input:

The monostable multivibrators U1A and U1B operate in initial status. At this time, the U1A-$\overline{Q}$ output from the monostable mulbivibrator U1A is a positive pulse at high level, the U1B-Q output from the monostable mulbivibrator U1B is a negative pulse at low level, that is, the pulse at high level and the pulse at low level are respectively input to the Set pin and the Reset pin of the D-type flip-flop U3A. Referring to FIG. 8, the D-type flip-flop U3A operates in the operation mode 2 and outputs the pulse U3A-Q at low level.

Status 2. Between 0 μs and 5 μs (including 5 μs) after the synchronization pulse comes:

Excited by the rising edge of the synchronization pulse, the U1A-$\overline{Q}$ is an output pulse at low level, and the U1B-Q is an output pulse at high level, that is, the pulse at low level and the pulse at high level are respectively input to the Set pin and the Reset pin of the D-type flip-flop U3A. Referring to FIG. 8, the D-type flip-flop U3A operates in the operation mode 1, and the U3A-Q is an output pulse at high level.

Status 3. Between 5 μs (excluding 5 μs) and 15 μs (including 15 μs) after the synchronization pulse comes:

After having been excited by the rising edge of the synchronization pulse for 5 μs, the output precise pulse U1A-$\overline{Q}$ reaches to the preset width and jumps to high level again, while the U1B-Q continues to keep at high level, that is, both of the Set pin and the Reset pin of the D-type flip-flop U3A are at high level. It can be seen from the functions of the D-type flip-flop U3A as shown in FIG. 8 that the D-type flip-flop U3A operates in the operation mode 5 and the D-type flip-flop U3A is controlled by the signal input to the CLK pin. When there is a pulse with a rising edge input to the CLK pin, the U3A-Q is at low level. Therefore, when the synchronization pulse whose duration is 10 μs ends, the U3A is controlled by the rising edge of the inverted synchronization pulse signal, and the U3A-Q becomes at low level.

It can be seen from the complete signals as shown in FIG. 9 that the output pulse U3A-Q conforms to the input synchronization pulse. That is, when the width (10 μs) of the synchronization pulse input to the circuit as shown in FIG. 6 is within the required range, the circuit as shown in FIG. 6 can output a synchronization pulse with the same width (10 μs).

Figure 10:
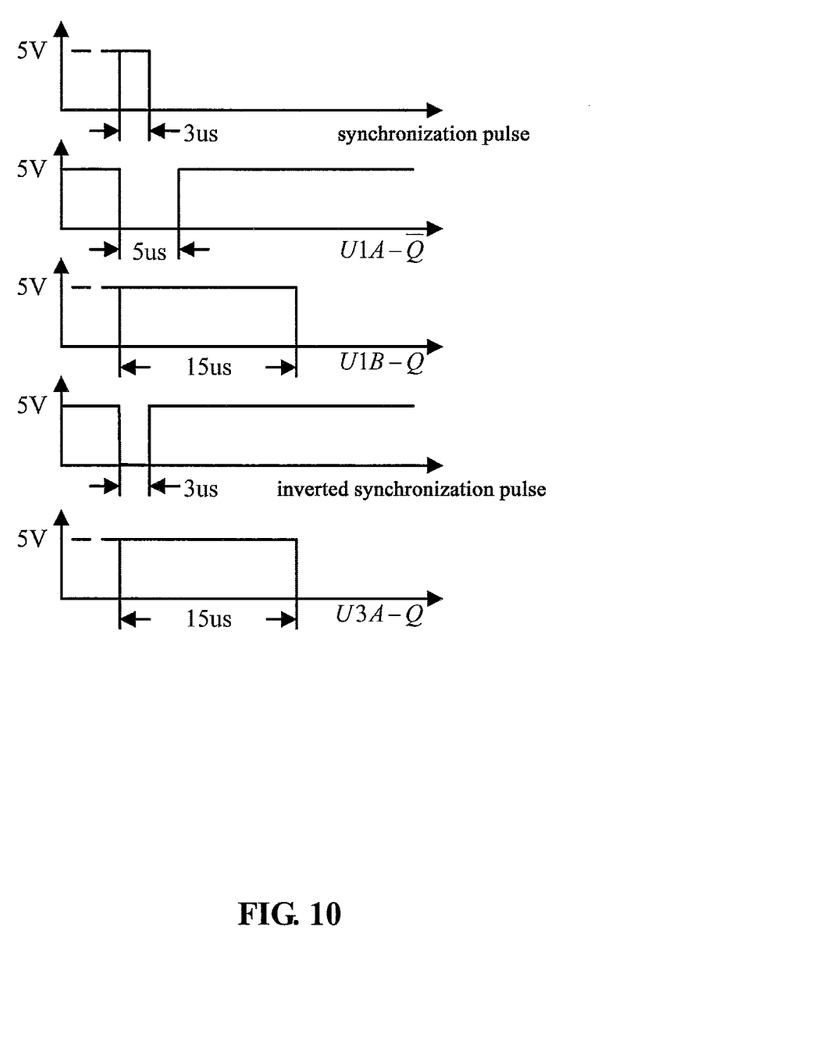
FIG. 10 is a schematic diagram showing waveforms of signals generated when a pulse width control device provided by an embodiment of the invention processes an input synchronization pulse with a too short width.

When the width of the synchronization pulse input from the outside is too short, for example, the synchronization pulse is a positive pulse whose duration is 3 μs, and the widths of pulses output from the monostable multivibrators U1A and U1B in the circuit as shown in FIG. 6 are respectively set to be 5 μs and 15 μs, the operation process of the circuit as shown in FIG. 6 is divided into following four statuses by referring to FIG. 10:

Status 1. No external synchronization pulse is input:

The U1A-$\overline{Q}$ is at high level, the U1B-Q is at low level, the U3A operates in the operation mode 2, and the U3A-Q is at low level.

Status 2. Between Ops and 5 μs (including 5 us) after the synchronization pulse comes:

Excited by the rising edge of the synchronization pulse, the U1A-$\overline{Q}$ becomes at low level, the U1B-Q becomes at high level, the D-type flip-flop U3A operates in the operation mode 1, and although the input synchronization pulse only lasts 3 μs, the U3A-Q still keeps at high level.

Status 3. Between 5 μs (excluding 5 μs) and 15 μs (including 15 μs) after the synchronization pulse comes:

Beginning with receipt of the excitation of the rising edge of the synchronization pulse, when it exceeds 5 μs, the U1A-$\overline{Q}$ jumps to high level again, the U1B-Q continues to keep at high level, the D-type flip-flop U3A operates in the operation mode 5, and the D-type flip-flop U3A is controlled by the signal input to the clock CLK pin. Since the synchronization pulse is over, the level of the signal input to the CLK pin will not jump, and the U3A-Q keeps at high level.

Status 4. After 15 μs (excluding 15 μs) after the synchronization pulse comes:

Beginning with receipt of the excitation of the rising edge of the synchronization pulse, when it exceeds 15 μs, the U1A-$\overline{Q}$ continues to keep at high level, while the U1B-Q jumps to low level again, the D-type flip-flop U3A returns to the operation mode 2, and the U3A-Q becomes at low level.

It can be seen from the complete signals as shown in FIG. 10 that the circuit as shown in FIG. 6 converts the input synchronization pulse with a width (3 μs) shorter than the required shortest width (5 μs) into a pulse with the permissible largest width (15 μs) for outputting, thereby overcoming the adverse effect which may result from the short pulse.

Figure 11:
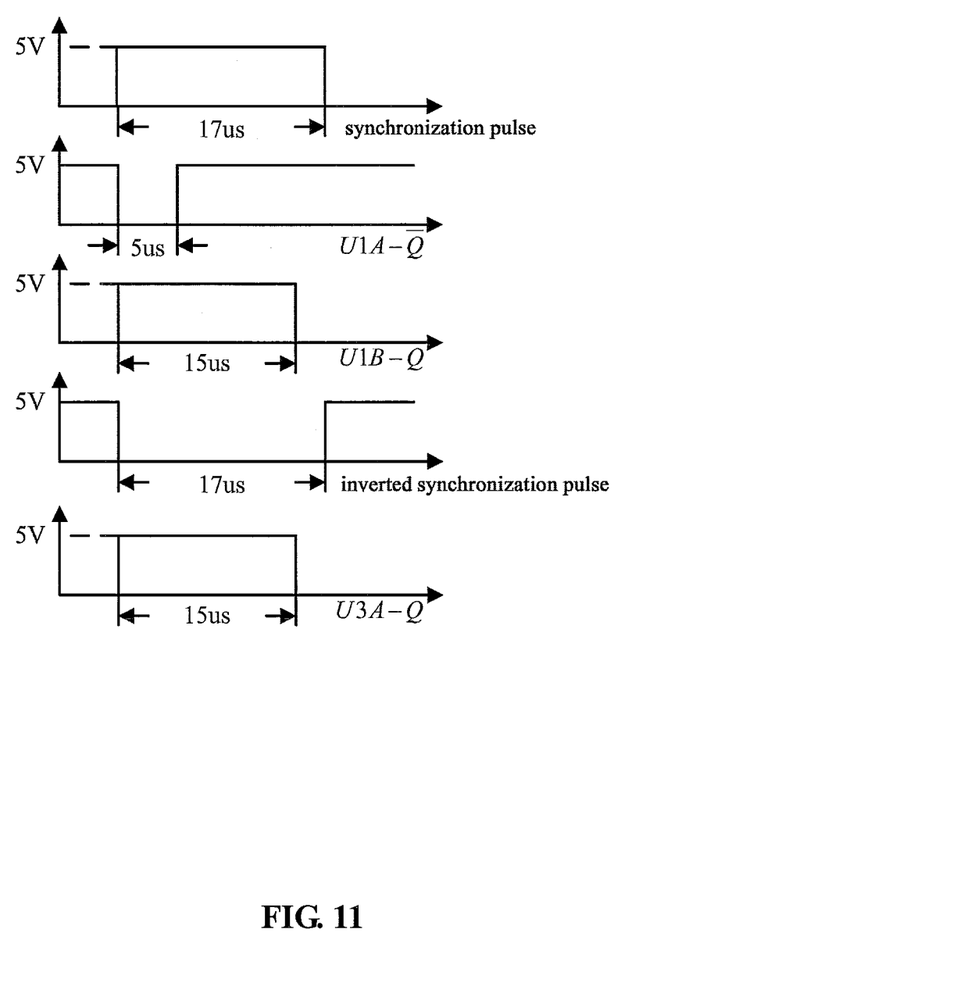
FIG. 11 is a schematic diagram showing waveforms of signals generated when a pulse width control device provided by an embodiment of the invention processes an input synchronization pulse with a too long width.

Likewise, when the width of the input synchronization pulse signal is too long, for example, when a positive pulse whose width is 17 μs is input, and the widths of pulses output from the monostable multivibrators U1A and U1B in the circuit as shown in FIG. 6 are respectively set to be 5 μs and 15 μs, the operation process of the circuit as shown in FIG. 6 is divided into following four statuses by referring to FIG. 11:

Status 1. No external synchronization pulse is input:

The U1A-$\overline{Q}$ is at high level, the U1B-Q is at low level, the U3A operates in the operation mode 2, and the U3A-Q is at low level.

Status 2. Between Op and 5 μs (including 5 μs) after the synchronization pulse comes:

Excited by the rising edge of the synchronization pulse, the U1A-$\overline{Q}$ becomes at low level, the U1B-Q becomes at high level, the U3A operates in the operation mode 1, and the U3A-Q becomes at high level.

Status 3. Between 5 μs (excluding 5 μs) and 15 μs (including 15 μs) after the synchronization pulse comes:

Beginning with receipt of the excitation of the rising edge of the synchronization pulse, when it exceeds 5 μs, the U1A-$\overline{Q}$ jumps to high level again, the U1B-Q continues to keep at high level, the D-type flip-flop U3A operates in the operation mode 5, and the D-type flip-flop U3A is controlled by the signal input to the clock CLK pin. Since the synchronization pulse is too long in width, the signal at the CLK terminal does not jump and the U3A-Q keeps at high level during this period of time.

Status 4. After 15 μs (excluding 15 μs) after the synchronization pulse comes:

Beginning with receipt of the excitation of the rising edge of the synchronization pulse, when it exceeds 15 μs, the U1A-$\overline{Q}$ continues to keep at high level, while the U1B-Q jumps to low level again, the D-type flip-flop U3A returns to the operation mode 2, and although the synchronization pulse (17 μs) input from the outside is not over, the U3A-Q still becomes at low level.

It can be seen from the complete signals as shown in FIG. 11 that the circuit as shown in FIG. 6 converts the input synchronization pulse with a width (17 μs) longer than the required longest width (15 μs) into a pulse with the permissible largest width (15 μs) for outputting, thereby overcoming the adverse effect which may result from the long pulse.

In addition, the foregoing description is made by taking an example of the input synchronization pulse being a positive pulse. Of course, for the case where the input synchronization pulse is a negative pulse, the technical solution provided by the embodiments of the invention can be still used. For example, only an inverter needs to be added to convert the input synchronization pulse from a negative pulse into a positive pulse, thus the pulse width control can be realized by using the circuit as shown in FIG. 6 in the embodiments of the invention in the same manner.

In view of the above, it can be seen from the pulse waveforms as shown in FIGS. 9-11 that, the circuit for controlling the synchronization pulse provided by the embodiments of the invention perform no processing on the synchronization pulse with a satisfactory width, and generates and outputs the synchronization pulse completely conforming to the input synchronization pulse to the subsequent high-voltage pulse generating device. For the synchronization pulse with a width shorter than the required shortest width or longer than the required longest width, a synchronization pulse with the permissible longest width is output to protect the subsequent high-voltage pulse generating device etc. It can be seen from the structure of the circuit as shown in FIG. 6 that the structure of the whole protection circuit is simple, and it is convenient to debug since the protection range of the pulse width can be adjusted flexibly by adjusting values of the two resistors and the two capacitors, and moreover, the monostable multivibrators with the model number of 74HC4538, the inverter with the model number of 74HC04 and the D-type flip-flop with the model number of 74HC74 are low in cost, therefore, the embodiments of the invention can be implemented at a low cost.

The method provided by the embodiments of the invention is described in connection with the accompanying figure below.

Figure 12:
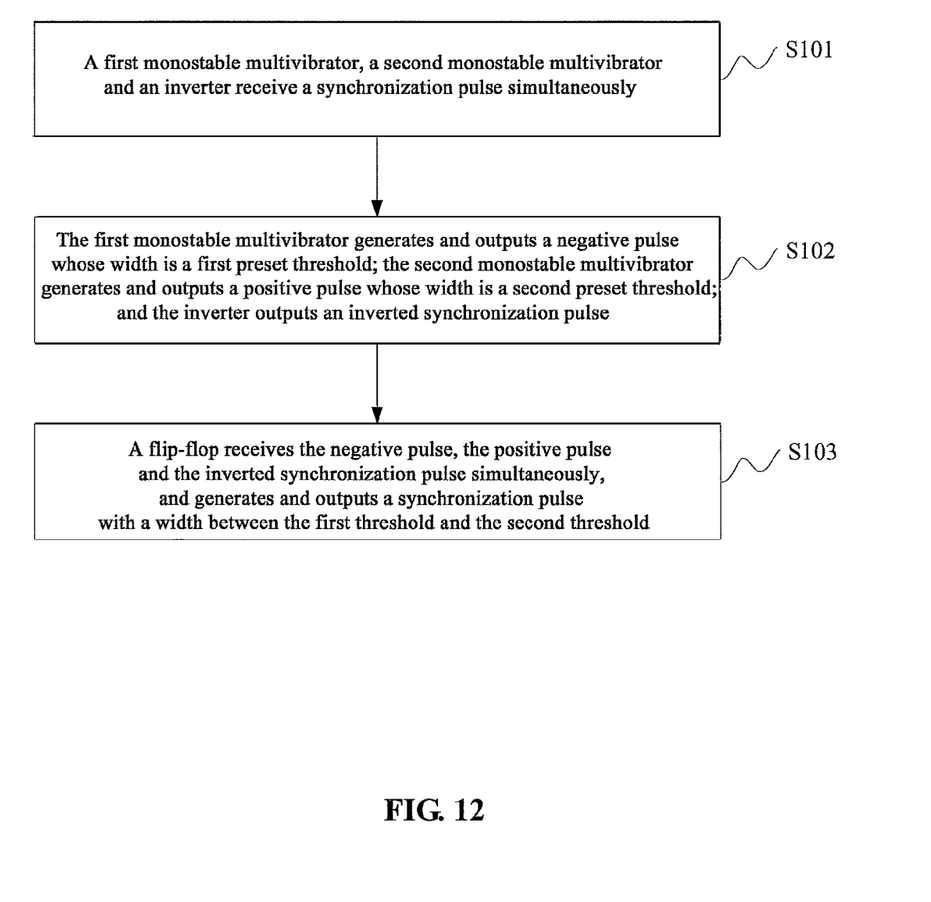
FIG. 12 is a flow chart illustrating a pulse width control method provided by an embodiment of the invention.

Referring to FIG. 12, a pulse width control method provided by the embodiments of the invention includes:

S101. A first monostable multivibrator, a second monostable multivibrator and an inverter receive a synchronization pulse simultaneously.

S102. A negative pulse whose width is a first preset threshold is generated and output by the first monostable multivibrator; a positive pulse whose width is a second preset threshold is generated and output by the second monostable multivibrator; the synchronization pulse is inverted and then an inverted synchronization pulse is output by the inverter.

S103. Said negative pulse, said positive pulse and said inverted synchronization pulse are received simultaneously and a synchronization pulse with a width between said first threshold and said second threshold is generated and output by a flip-flop.

Wherein setting said first threshold can be realized by setting values of a first resistor and a first capacitor connected to said first monostable multivibrator; setting said second threshold can be realized by setting values of a second resistor and a second capacitor connected to said second monostable multivibrator.

Summing up the above, the embodiments of the invention achieve the control of the synchronization pulse width and filter the synchronization pulse with a too short or too long width which will adversely affect the rear-end high-voltage pulse generating device by introducing the protection circuit consisting of the monostable multivibrators, the inverter and the D-type flip-flop having Reset/Set functions, so that not only the normal operation and the printing quality of the spray head can be guaranteed, but also the whole circuit is simple in structure, convenient in debugging, and low in cost.

It is apparent to those skilled in the art that various variations and modifications may be done without departing from the sprits and the scopes of the present invention. Thus, given that these variations and modifications made to the invention belong to the scope of the claims of the invention and equivalent thereof, these variations and modifications are intended to be encompassed within the invention.

The invention claimed is:

1. An inkjet printing device, including a spray head for jetting ink and a high-voltage pulse generating device for generating a high-voltage excitation pulse, for controlling the ink jetting of the spray head, by using a synchronization pulse, with said inkjet printing device further including a pulse width control device for controlling widths of the synchronization pulse input into said high-voltage pulse generating device, the pulse width control device comprising:
   a first monostable multivibrator, for receiving the synchronization pulse, and using said synchronization pulse to generate and output a negative pulse whose width is a first preset threshold;
   a second monostable multivibrator, for receiving said synchronization pulse, and using said synchronization pulse to generate and output a positive pulse whose width is a second preset threshold;
   an inverter, for receiving said synchronization pulse, and inverting said synchronization pulse and then outputting an inverted synchronization pulse; and
   a flip-flop, for receiving said negative pulse, said positive pulse and said inverted synchronization pulse, and generating and outputting a synchronization pulse with a width between said first threshold and said second threshold to said high-voltage pulse generating device.

2. The device according to claim 1, wherein said pulse width control device further includes:
   a first threshold setting unit, connected to said first monostable multivibrator, and used for setting said first threshold; and
   a second threshold setting unit, connected to said second monostable multivibrator, and used for setting said second threshold.

3. The device according to claim 2, wherein
   said first threshold setting unit includes a first resistor and a first capacitor, and sets said first threshold by setting values of said first resistor and said first capacitor; and
   said second threshold setting unit includes a second resistor and a second capacitor, and sets said second threshold by setting values of said second resistor and said second capacitor.

4. The device according to claim 3, wherein said flip-flop outputs said synchronization pulse with a width between said first threshold and said second threshold by its pin for outputting a positive pulse.

5. The device according to claim 2, wherein said flip-flop outputs said synchronization pulse with a width between said first threshold and said second threshold by its pin for outputting a positive pulse.

6. The device according to claim 1, wherein said flip-flop receives said negative pulse by its Set Pin, receives said positive pulse by its Reset Pin and receives said inverted synchronization pulse by its Clock Pin; and a pin of the flip-flop for inputting data is connected to the ground.

7. The device according to claim 6, wherein said flip-flop outputs said synchronization pulse with a width between said first threshold and said second threshold by its pin for outputting a positive pulse.

8. The device according to claim 1, wherein said flip-flop outputs said synchronization pulse with a width between said first threshold and said second threshold by its pin for outputting a positive pulse.

9. A pulse width control device, comprising:
a first monostable multivibrator, for receiving a synchronization pulse, and using the synchronization pulse to generate and output a negative pulse whose width is a first preset threshold;
a second monostable multivibrator, for receiving said synchronization pulse, and using the synchronization pulse to generate and output a positive pulse whose width is a second preset threshold;
an inverter, for receiving said synchronization pulse, and inverting said synchronization pulse and then outputting an inverted synchronization pulse; and
a flip-flop, for receiving said negative pulse, said positive pulse and said inverted synchronization pulse, and generating and outputting a synchronization pulse with a width between said first threshold and the second threshold.

10. A pulse width control method, comprising:
a first monostable multivibrator receiving a synchronization pulse, and generating and outputting a negative pulse whose width is a first preset threshold;
a second monostable multivibrator receiving said synchronization pulse, and generating and outputting a positive pulse whose width is a second preset threshold;
an inverter receiving said synchronization pulse, and inverting said synchronization pulse and then outputting an inverted synchronization pulse; and
a flip-flop receiving said negative pulse, said positive pulse and said inverted synchronization pulse, and generating and outputting a synchronization pulse with a width between said first threshold and the second threshold.

11. The method according to claim 10, wherein said first threshold is determined by values of a first resistor and a first capacitor connected to said first monostable multivibrator; and
said second threshold is determined by values of a second resistor and a second capacitor connected to said second monostable multivibrator.

12. The method according to claim 10, wherein said flip-flop receives said negative pulse by its Set Pin, receives said positive pulse by its Reset Pin and receives said inverted synchronization pulse by its Clock Pin; and a pin of said flip-flop for inputting data is connected to the ground.

13. The method according to claim 10, wherein said flip-flop outputs said synchronization pulse with a width between said first threshold and said second threshold by its pin for outputting a positive pulse.

* * * * *

UNITED STATES PATENT AND TRADEMARK OFFICE
CERTIFICATE OF CORRECTION

PATENT NO. : 8,608,265 B2  Page 1 of 1
APPLICATION NO. : 13/062596
DATED : December 17, 2013
INVENTOR(S) : Yu et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 396 days.

Signed and Sealed this
Twenty-second Day of September, 2015

Michelle K. Lee
*Director of the United States Patent and Trademark Office*